United States Patent [19]

Takenaka

[11] Patent Number: 5,293,510
[45] Date of Patent: Mar. 8, 1994

[54] SEMICONDUCTOR DEVICE WITH FERROELECTRIC AND METHOD OF MANUFACTURING THE SAME

[75] Inventor: Kazuhiro Takenaka, Suwa, Japan

[73] Assignee: Ramtron International Corporation, Colorado Springs, Colo.

[21] Appl. No.: 778,895

[22] Filed: Dec. 20, 1991

[30] Foreign Application Priority Data

| Apr. 24, 1990 [JP] | Japan | 2-108011 |
| Apr. 24, 1990 [JP] | Japan | 2-108012 |
| Apr. 24, 1990 [JP] | Japan | 2-108013 |

[51] Int. Cl.$^5$ .............. H01L 29/68; H01L 29/78; H01L 29/92
[52] U.S. Cl. .................. 257/295; 257/306; 365/145
[58] Field of Search ........... 257/295, 306; 365/145

[56] References Cited

U.S. PATENT DOCUMENTS

| 4,149,301 | 4/1979 | Cook. | |
| 4,982,309 | 1/1991 | Shepherd | 361/321 |
| 5,053,917 | 10/1991 | Miyasaka et al. | 361/321 |

FOREIGN PATENT DOCUMENTS

| 0415751 | 3/1991 | European Pat. Off. | H01L 29/92 |
| 2-232973 | 9/1990 | Japan | 257/295 |

*Primary Examiner*—Andrew J. James
*Assistant Examiner*—D. Monin
*Attorney, Agent, or Firm*—Edward D. Manzo; Mark J. Murphy

[57] ABSTRACT

The structural body of a ferroelectric capacitor C is located over a source region (23) between a gate electrode (22) and a local oxide film (26). The structural body has a ferroelectric film (29) and an upper electrode (30) and a lower electrode (31) for sandwiching the ferroelectric film (29), and is provided with a conductive oxide film (32) between the lower electrode (31) and the source region (23). The conductive oxide film (32) is ITO, $ReO_2$, $RuO_2$ or $MoO_3$. If an oxygen anneal is conducted after forming the ferroelectric film (29) for the purpose of reforming crystallizability of the ferroelectric film (29), oxygen enters into the conductive oxide film (32) to some extent. As a result, the conductive oxide film (32) is further oxidized, and becomes a so-called oxide barrier or dummy layer. Therefore, formation of a silicon oxide film hardly occurs on the source interface, reduction of contact resistance and avoidance of series parasitic capacitance can be attained, the degree of freedom of the capacitor C forming region is increased, and a high density integration can be schemed.

9 Claims, 6 Drawing Sheets

SEMICONDUCTOR DEVICE WITH FERROELECTRIC AND METHOD OF MANUFACTURING THE SAME

Semiconductor device having a ferroelectric device and method of manufacturing the same.

FIELD OF THE INVENTION

The invention relates to a semiconductor device having a ferroelectric device such as a ferroelectric capacitor for a non-volatile memory and a method of manufacturing the same.

BACKGROUND OF THE INVENTION

A non-volatile memory with the use of a polarization reversible ferroelectric material by an opposite polarity of an applied voltage has equal information write-in time and information read-out time in principle. Moreover the standstill condition (backup time) can maintain polarization (residual polarization) even with no applied voltage, so that the non-volatile memory appears to be ideal.

Previously, semiconductor non-volatile memories having ferroelectric capacitors have been proposed wherein a ferroelectric capacitor is located on a silicon (Si) substrate (See U.S. Pat. No. 4,149,302), and having a ferroelectric film located on an MIS-type transistor gate electrode (See U.S. Pat. No. 3,832,700).

A typical non-volatile memory cell, as shown in FIG. 8, generally has a circuit construction with an N-type MOS transistor Tr having a gate electrode G connected to word line W. A drain electrode D is connected to a bit line B, and a source electrode S is connected to one electrode of a ferroelectric capacitor C. The other electrode of the ferroelectric capacitor C is connected to a plate line P. An example of a semiconductor structure for such a memory cell is shown in FIG. 9. The semiconductor structure shown in FIG. 9 has an N-type MOS transistor Tr. Transistor Tr comprises a polysilicon (polycrystalline silicon) gate electrode 3 formed over a gate oxide film 2 on a P-type silicon substrate 1, a high concentration N-type source region 4 and a drain region 5 diffused and formed in the silicon substrate 1 by self-alignment, and a ferroelectric capacitor C formed on an interlayer insulating film 7 such as phosphorus glass on an element separating local oxide film (LOCOS) 6. The ferroelectric capacitor C on the interlayer insulating film 7 is formed by successively laminating a lower electrode 8 such as platinum (Pt), a ferroelectric film 9 such as PZT and an upper electrode 10 such as aluminum (Al). The source region 4 and the upper electrode 10, as high concentration diffusion regions, are connected to a wiring 12 of Al via a contact hole 11. A second interlayer insulating film 13 such as phosphorus glass is located over transistor Tr.

In forming the ferroelectric capacitor C via the interlayer insulating film 7 on the local oxide film 6, the ferroelectric capacitor C is formed by effectively utilizing a space on the local oxide film 6. However, the length of the wiring 12 from the source region 4 to the upper electrode 10 is redundant and increases the size of the area occupied by the memory cell. While a memory cell of this structure results in an increase of the cell area, it can be said to be realistic structure for the reason mentioned below. FIG. 10 shows an example of a memory cell structure wherein a ferroelectric film 9 is located directly on a source region. A polysilicon upper electrode wiring 14 was formed on the ferroelectric film 9, and the source region 4 itself acts as a lower electrode. After forming the ferroelectric film 9, however, it was necessary to apply an oxygen anneal to improve the crystallizability of the film and to enhance the specific dielectric constant $\epsilon_r$. Because of the strong reactivity of oxygen in the oxygen anneal step, a silicon oxide film ($SiO_2$) 15 inevitably forms between the source region 4 and the ferroelectric film 9. When this film 15 is very thin, as shown in FIG. 11(A), the silicon oxide film 15 becomes a series contact resistance $R_O$. The presence of this parasitic contact resistance $R_O$ occasions a delay in access time. Moreover, when the film 15 is relatively thick, the film 15 becomes a series parasitic capacitor $C_O$ as shown in FIG. 11(B). In such a case, memory capacity is the result of the synthetic capacity of the parasitic capacitor $C_O$ and the ferroelectric capacitor C in series. However, to this parasitic capacitor $C_O$ is applied a partial tension of the source voltage. In order to prevent the silicon oxide film 15 from dielectric breakdown due to the partial tension, it is necessary to either form a considerably thicker film or to suppress the partial tension itself. However, if the silicon oxide film 15 is made considerably thicker, its partial tension also becomes large, so that pressure resistivity is not effectively improved. Moreover, in order to directly suppress partial tension, it is necessary to either make the silicon oxide film 15 very thin or to make the ferroelectric film 9 considerably thicker. However, it is difficult to make the silicon oxide film 15 very thin owing to the above-described oxygen anneal treatment, while the considerably thicker ferroelectric film 9 means a lower capacitance for the ferroelectric capacitor C, and as a result, the ferroelectric capacitor cannot perform its function. For such reasons, the structure (circuitry) shown in FIG. 8 is useful as a non-volatile memory structure for sufficiently bringing out the function of a ferroelectric capacitor. However, as stated above, the structure has the problem of utilizing a large cell area.

Therefore, the present invention takes the problems of each of the above structures into consideration, and provides a semiconductor device having a ferroelectric device, without spoiling the function of a non-volatile memory using a ferroelectric material and without increasing the memory cell area for a ferroelectric capacitor. The present invention also discloses a method of manufacturing the same.

SUMMARY OF THE INVENTION

The present invention provides a structure for forming a ferroelectric device in a semiconductor substrate or on the main plane or in the inner part of the semiconductor substrate. As a typical semiconductor substrate, a silicon substrate, for example, a compound semiconductor such as gallium-arsenide, can be applied to an oxygen-coupling substrate. The region of the ferroelectric forming structure may be an intrinsic semiconductor region, and an N-type or P-type region of an impurity diffusion region. Examples of the impurity diffusion region are a source region or a drain region of a MIS-type transistor and a triode diffusion region of a bipolar transistor. Further, it is possible to form the ferroelectric forming structure on not only the active region of an active element but also on each region of passive elements such as a diffusion resistance layer and a stopper region. It is also possible to form a ferroelectric capacitor stacking on the diffusion region, or within a trench. The present invention employs a sandwich structure of a conductive oxide film between a semiconductor substrate and an electrode of a ferroelectric. That is, the present invention employs a laminated structure of a semiconductor substrate, a conductive oxide film, an electrode and a ferroelectric film, in this order. As the ferroelectric film, a compound comprising $PbTiO_2$, $PZT(PbZrO_3, PbTiO_3)$ or PLZT (La, $PbZrO_3, PbTiO_3$) may be used. The ferroelectric film of this kind is formed by a sputtering method and thereafter subjected to an oxygen anneal for improving the dielectric constant. The electrode for the ferroelectric film comprises Pt and Pd for example. Preferably Pt, which is close to crystal lattice constant of the ferroelectric film, is used. The conductive oxide film may preferably be either Ru oxide film, Re oxide film, Mo oxide film, ITO (indium-tin-oxide) film, or a mixed film of more than two of them. The structure of sandwiching the conductive oxide film between the semiconductor substrate and the electrode prevents generation of an oxide film of the interface of a semiconductor substrate during the oxygen anneal. Therefore, reduction of contact resistance and avoidance of parasitic series capacitance can be attained. Therefore, it is not necessary to provide a ferroelectric element of the LOCOS of the semiconductor substrate, freedom of the forming region is enlarged, and the structure contributes to high density integration.

A second embodiment of the present invention is directed to establishing a conductive oxide formable conductive metal film between the semiconductor substrate and the conductive oxide film. The conductive metal film may be a metal film which cannot form a conductive oxide. As described above, the conductive oxide film per se is conductive and has an oxygen barrier or dummy properties. However, it is preferable to use a conductive metal which can form a conductive oxide. Such a conductive oxide film can sufficiently secure the oxygen dummy properties and exclude any process addition. The conductive metal film is, for example, either Ru film, Re film and Mo film, or a mixed film of two or more of them. For the purpose of further reducing contact resistance, it is preferable to form a metal silicide film consisting essentially of a metal of Ti, Pt, Ru, Re, Mo, W and Ta.

A method of manufacturing the semiconductor device of the second embodiment of the present invention involves utilizing an oxygen anneal for a ferroelectric film. First, a conductive oxide formable conductive metal film is deposited on the main plane or inner surface of a semiconductor substrate. For example, deposition can be by a sputtering method. Second, on the conductive metal layer are successively laminated said electrode and said ferroelectric film. These films are formed by a sputtering method. There is applied an oxygen anneal (heat treatment in an atmosphere including oxygen) aimed at modification of the crystallizability of the ferroelectric film. This oxygen anneal not only improves the specific dielectric constant due to improvement of crystallizability of the ferroelectric film, but also modifies crystallizability when Pt is used as an electrode, and two actions are simultaneously applied to the conductive metal film. Oxidation proceeds in the conductive metal film on the electrode side to form a conductive oxide film, and a metal silicide film is formed on the substrate interface. Formation of the latter contributes to reduction of contact resistance. As the conductive metal film, it is preferable to use a metal having two-sidedness, either Ru, Re and Mo, or a mixture of two or more of them.

DETAILED DESCRIPTION OF THE PRESENTLY PREFERRED EMBODIMENTS

Examples relating to the present invention are explained based on the accompanying drawings as follows.

EXAMPLE 1

Figure 1:
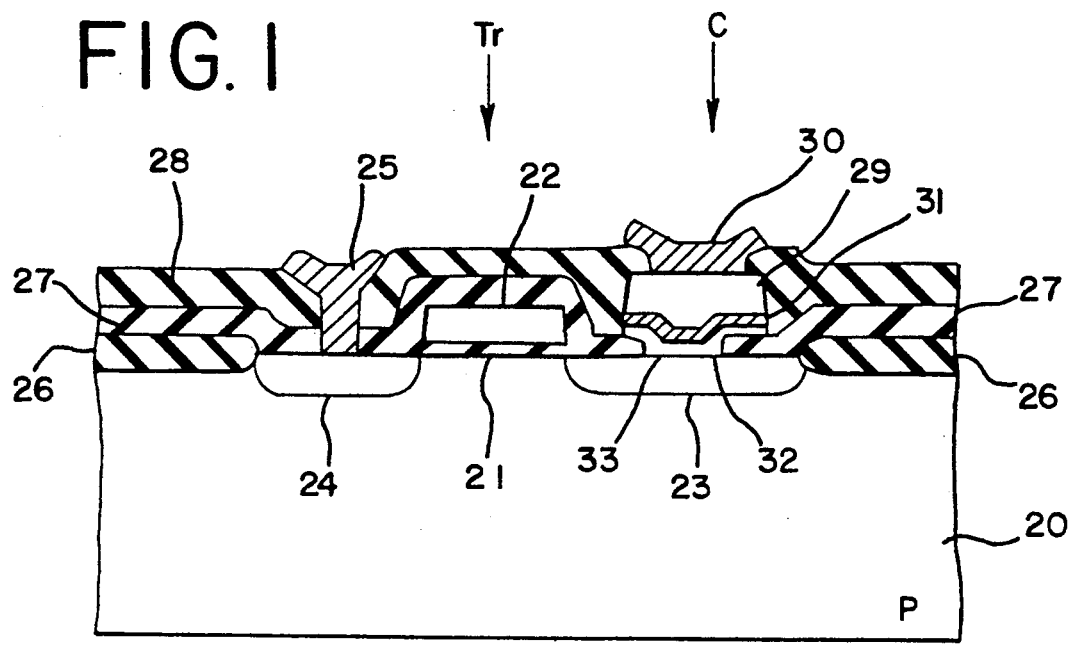
FIG. 1 is a cross section view showing a semiconductor device having a ferroelectric capacitor as in Example 1 of the present invention.

FIG. 1 is a cross section view showing a semiconductor device having a ferroelectric capacitor according to Example 1 of the present invention.

Figure 8:
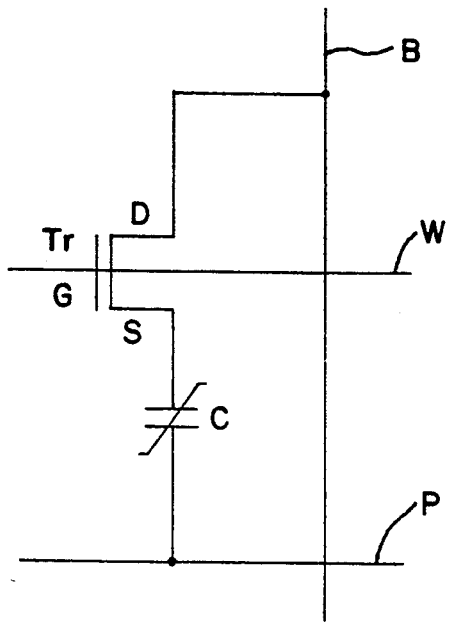
FIG. 8 is a circuit diagram of a non-volatile memory cell.

The semiconductor device in FIG. 1 is a non-volatile memory, and has a circuit schematic similar to that shown in FIG. 8. In this example, use is made of a P type silicon substrate 20 as a wafer of specific resistance, for example 20 ohm-cm, in which an N-type transistor Tr and a ferroelectric capacitor C are formed. The semiconductor structure of the N type MOS transistor Tr comprises a phosphorus doped polysilicon gate electrode 22 formed over a gate insulating film (silicon oxide film) 21 on the silicon substrate 20; a source region 23 as a high concentration N type impurity diffusion region within the substrate 20 formed by ion injecting phosphorous at an acceleration voltage of 80 Kev and injection density of $5 \times 10^{15}$ cm$^{-2}$ by self alignment with the use of the gate electrode 22 as a mask; and a drain region 24. To the drain region 24 is connected a wiring electrode 25 of Al formed in a contact hole by a deposition method. A local oxide film (LOCOS) 26 for separating elements of about 6000 Å in thickness is included. Moreover, a first interlayer insulating film 27, and a second interlayer insulating film 28, for example phosphorus glass of about 4000 Å in thickness and formed by a vapor phase forming method are also included.

In these Examples, on the source region 23, between the gate electrode 22 and the local oxide film 26, is located a structural body of the ferroelectric capacitor C as a ferroelectric forming structure. This structural body has a ferroelectric film 29 as a basis and an upper electrode 30 and a lower electrode 31 as plate layers for sandwiching the ferroelectric film 29, and has a conductive oxide film 32 between the lower electrode 31 and the source region 23. The ferroelectric film 29 is a compound comprising $PbTiO_3$, $PZT(PbZO_3, PbTiO_3)$ or $PLZT$ (La, $PbZrO_3$, $PbTiO_3$) and is formed by a sputtering method. The upper electrode 30 is aluminum (Al) or an alloy thereof having a low specific resistance and is formed by a deposition method. The lower electrode 31 is platinum (Pt) or palladium (Pd) and is formed by a sputtering method. When platinum (Pt) is selected as the lower electrode 31, and since the $PbTiO_3$, PZT, or PLZT of the ferroelectric film 29 is close to a lattice constant, crystallizability is simultaneously reformed by an oxygen anneal and a good electric characteristic is obtained. The conductive oxide film 32 sandwiched between the source region 23 and the lower electrode 31 is comprised of ITO (indium-tin oxide), rhenium oxide ($ReO_2$), ruthenium oxide ($RuO_2$) and molybdenum oxide ($MoO_3$) and is formed by a sputtering method. This conductive oxide film 32 is buried in a contact hole 33 which is bored in the first interlayer insulating film 27 of phosphorus glass, and is conductively contacted to the high concentration N type source region 23.

A method of forming a ferroelectric capacitor C involves first forming a contact hole in the first interlayer insulating film 27 which is coated over the source region 23. A conductive oxide layer is deposited by a sputtering method, and the conductive oxide film 32 is formed in the contact hole. The lower electrode 31 and the ferroelectric film 29 are further laminated by a sputtering method, respectively. Thereafter the whole surface is coated with the second interlayer insulating film 28. Thereafter, the upper electrode 30 and its wiring (plate line) and the drain electrode wiring 25 are formed by a photolithography technique.

The ferroelectric capacitor C is thus laminated on the source region 23 via the conductive oxide film 32. Therefore, a wiring plane occupied area between the source region 23 and the lower electrode 31 can effectively be economized, and reduction of a cell area is realized. Moreover, the silicon oxide film is not parasitic on the surface of the source region 23, so that a memory capacitor of the ferroelectric capacitor C only is formed.

In the above-described method, after the formation of the ferroelectric film 29, a heat treatment (oxygen anneal) is carried out in an atmosphere containing oxygen. This is for reforming the crystallizability of the ferroelectric film 29 and for increasing the specific dielectric constant $\epsilon_r$ to more than 1000 for example. In this oxygen anneal, oxygen enters into the ferroelectric film 29 and the crystal grain boundary of the lower electrode 31, and to some extent into the conductive oxide film 32. However, there is no problem even if the conductive oxide film 32 is further oxidized by the oxygen introduced during the anneal because the conductive oxide film 32 still has a conductivity. Rather, reservation of an oxidation reaction with the conductive film 32 has an action of reducing the formation of a silicon oxide film at the interface of the source region 23. As a result, the conductive oxide film 32 can be a so-called oxidation barrier or dummy layer. Therefore, a silicon oxide film is barely formed at the interface of the source region 23, so that reduction of contact resistance or avoidance of series parasitic capacitance can be attained. When platinum (Pt) is used for the lower electrode 31, as described above, crystallizability is reformed simultaneously with the ferroelectric film 29 during the oxygen anneal. For example, if the lower electrode 31 of platinum (Pt) is directly connected to the source region 23, the reactivity of platinum with silicon (Si) is too strong to invite diffusion of Pt within the substrate. However, downward diffusion can be prevented by interposing the conductive oxide film 32 therebetween. In a preferred embodiment a metal silicide (not shown) such as a titanium (Ti) silicide film is formed between the conductive oxide film 32 and the source region 23. In another embodiment a Ti film is sandwiched between the conductive oxide film 32 and the lower electrode 31.

Figure 9:
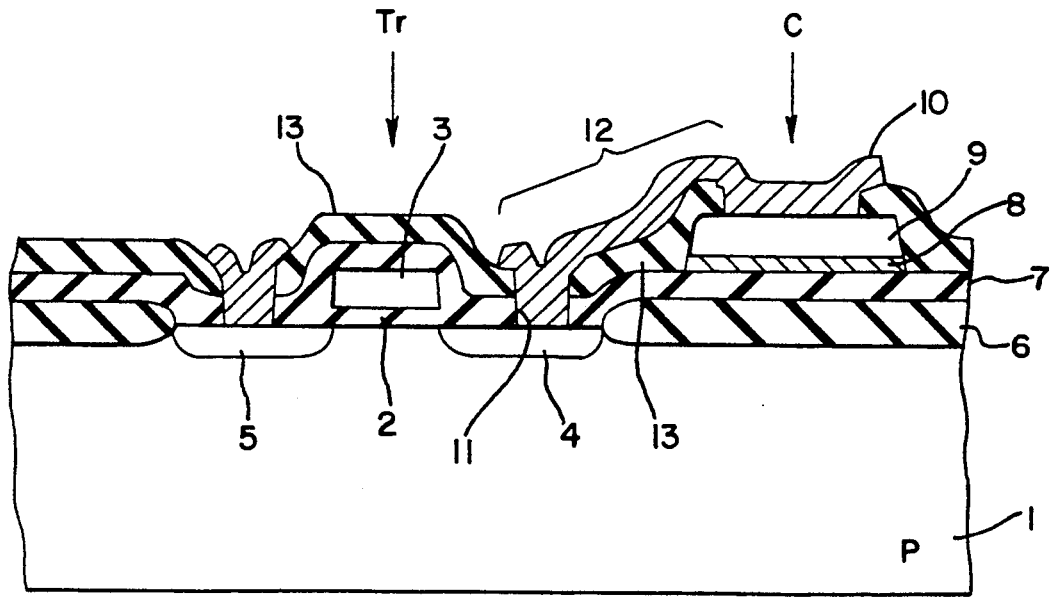
FIG. 9 is a cross section view showing a semiconductor device having a ferroelectric capacitor according to the prior art.
Figure 10:
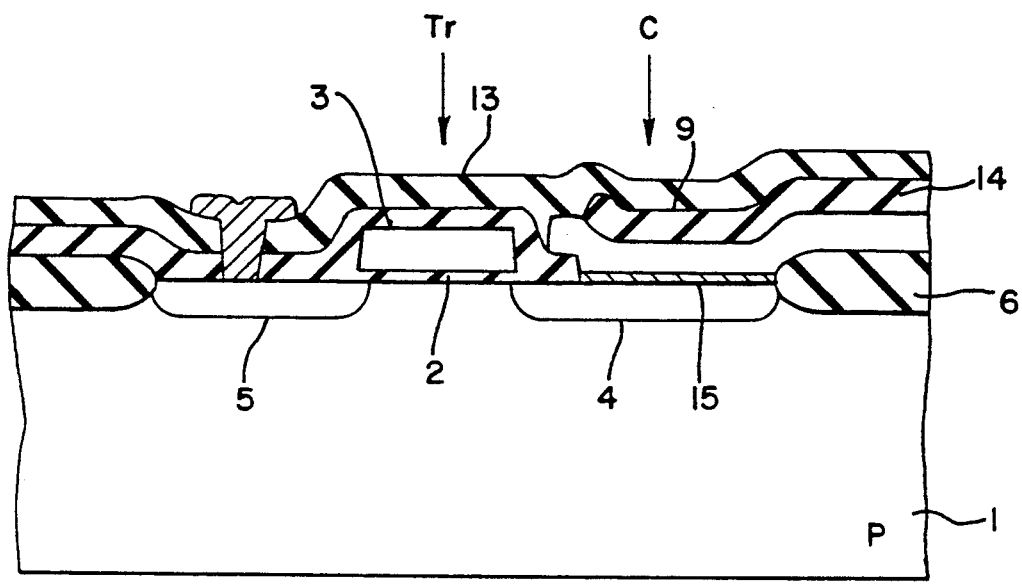
FIG. 10 is a cross section view showing another example of a semiconductor device having a ferroelectric capacitor according to the prior art.
Figure 11A:
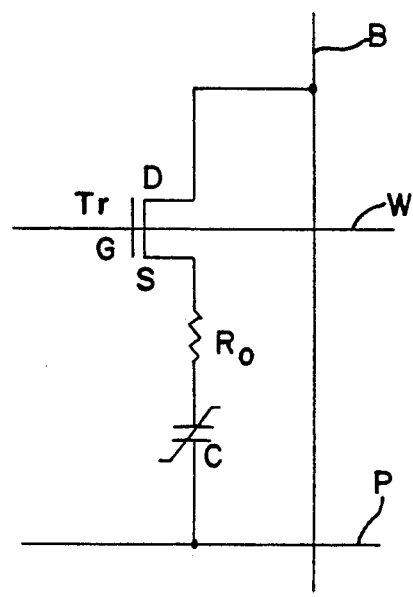
FIGS. 11(a) and (B) are circuit diagrams showing an equivalent circuit of the non-volatile memory cell of the semiconductor structure according to the same example.
Figure 11B:
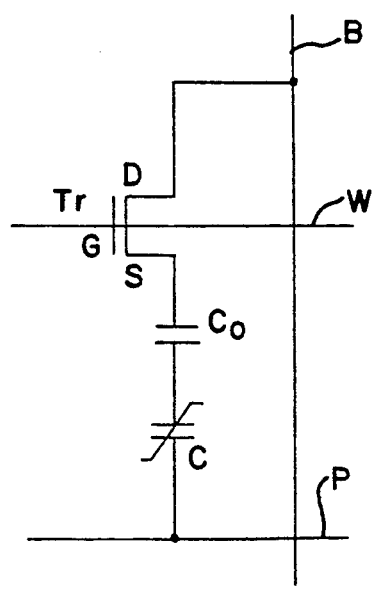

In a non-volatile memory having the conventional ferroelectric capacitor structure as shown in FIG. 9, the number of information rewritings in a structure without the conductive oxide film 32 is at most $10^5$. However, where rhenium oxide ($ReO_2$) is used as the conductive oxide film 32 as in the present Example, the number of information rewriting reached $10^{10}$. Moreover, for the specific dielectric constant $\epsilon_r$ of the ferroelectric film, a value of around 2000 was obtained.

The advantages of constructing a ferroelectric capacitor C having a vertical stacking structure on the source region 23 are reduction of cell area and reduction of one of the electrode contact portions (contact resistance portions) as compared with the structure of FIG. 9. The wiring 12 portion shown in FIG. 9 is substantially excluded. Therefore, the exclusion of the wiring portion contributes to reduction of information write-in and read-out time. As apparent from comparison of FIG. 1 and FIG. 9, the upper electrode 10 of FIG. 9, which connects PZT 9 to N source 4, corresponds to the lower electrode 31 of the present Example, and the lower electrode 8 of FIG. 9 corresponds to the upper electrode 30 of the present Example topologically. It is preferable that the lower electrode 31 comprises Pt in the present Example, but Pt is larger than Al in specific resistance. However, since the lower electrode 31 of the present Example is thin and since the contact area is larger than that of the contact hole, the resistance value between the source region 23 and the ferroelectric capacitor C is not a problem. Moreover, the upper electrode 30, as a plate line P in FIG. 8, and its wiring can be formed at Al. That is, the plate line P (of FIG. 8) can be formed on the ferroelectric film 29. Therefore, as compared with the prior art, the spread of the plate potential value by every cell is remarkably reduced. Moreover, the ferroelectric capacitor C has hitherto been vertically stacked on the thick LOCOS which results in a problem of step difference covering property of each film. However, in the present Example, the ferroelectric capacitor C is formed on both sides of the gate electrode 22 which improves the step difference covering property.

EXAMPLE 2

Figure 2:
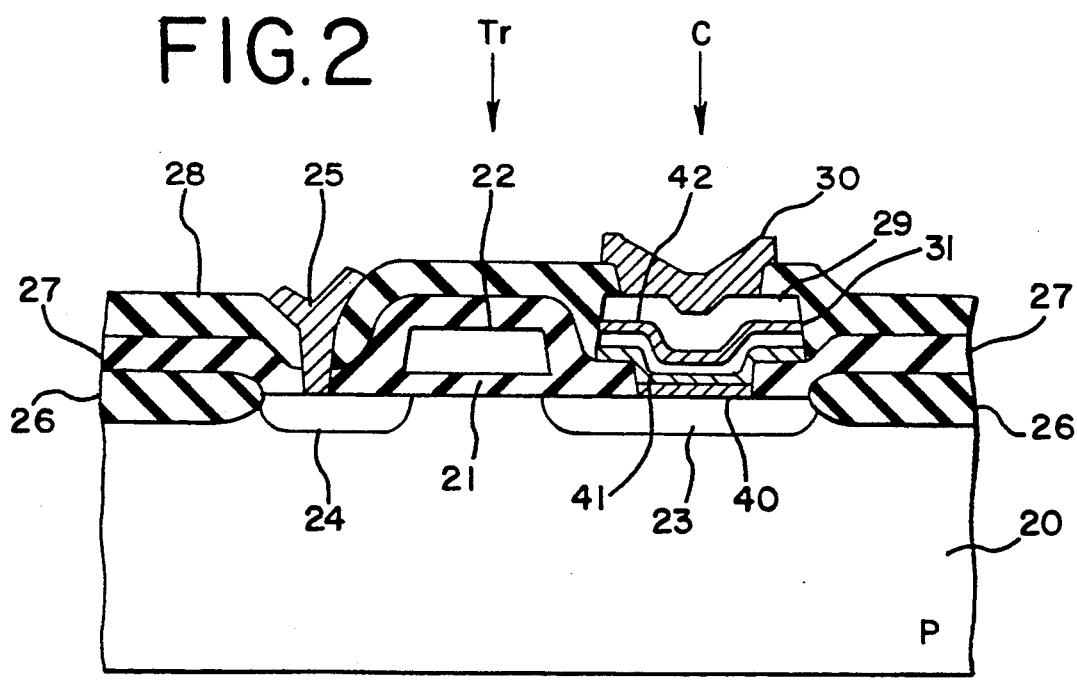
FIG. 2 is a cross section view showing a semiconductor device having a ferroelectric capacitor as in Example 2 of the present invention.

FIG. 2 is a cross sectional view showing the semiconductor device having a ferroelectric capacitor according to Example 2 of the present invention. In FIG. 2, like parts shown in FIG. 1 are designated by like reference numerals and the explanation thereof is omitted. In this Example, the ferroelectric capacitor C is stacked and formed on the source region 23. Between the source region 23 and the lower electrode 31 are successively stacked a metal silicide film 40, a conductive metal film 41 and a conductive oxide film 42. As the conductive metal film 41, a metal having conductivity such as rhenium (Re), ruthenium (Ru) or molybdenum (Mo) or the like is used. A lower layer of this conductive metal film 41 is the metal silicide film 40 consisting essentially of the above described metal. Between the conductive metal film 41 and the lower electrode 30 is sandwiched a conductive oxide film 42 such as rhenium oxide (ReO$_2$), ruthenium oxide (RuO$_2$) or molybdenum oxide (MoO$_3$) or the like. Example 2 differs from Example 1 in that the metal silicide film 40 and the conductive metal film 41 are interposed between the source region 23 and the conductive oxide film 42.

The reason for the conductive metal film 41 such as rhenium (Re), ruthenium (Ru) or molybdenum (Mo) or the like is to hold an object for forming the metal silicide film 40 and the other object for forming the conductive oxide film 42 simultaneously during the oxygen anneal of the ferroelectric film 29. The presence of the metal silicide film 40 reduces contact resistance.

A method of manufacturing the above Example 2 is explained based on FIGS. 3-4 as follows.

Figure 3A:
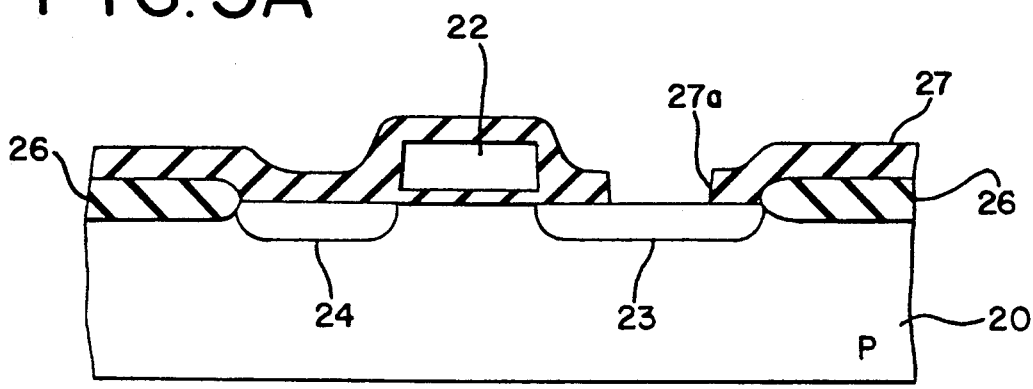
FIGS. 3(A), (B) and (C) are cross section views of steps for a manufacturing process of Example 2.
Figure 3B:
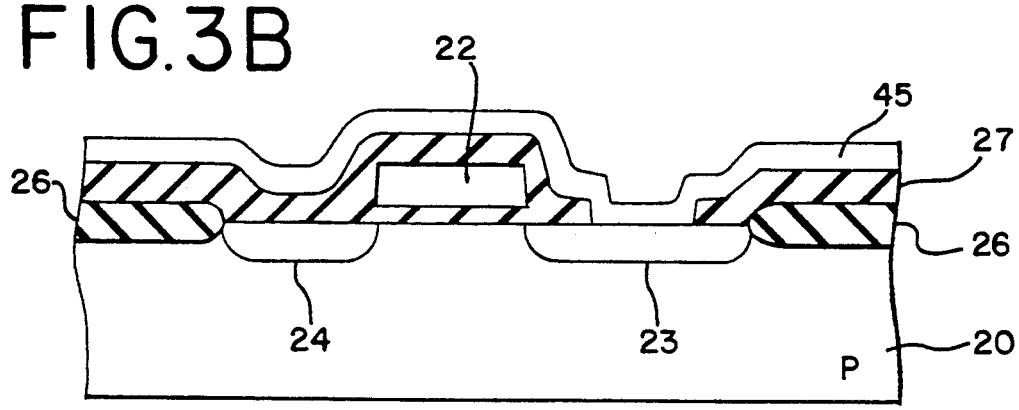
Figure 3C:
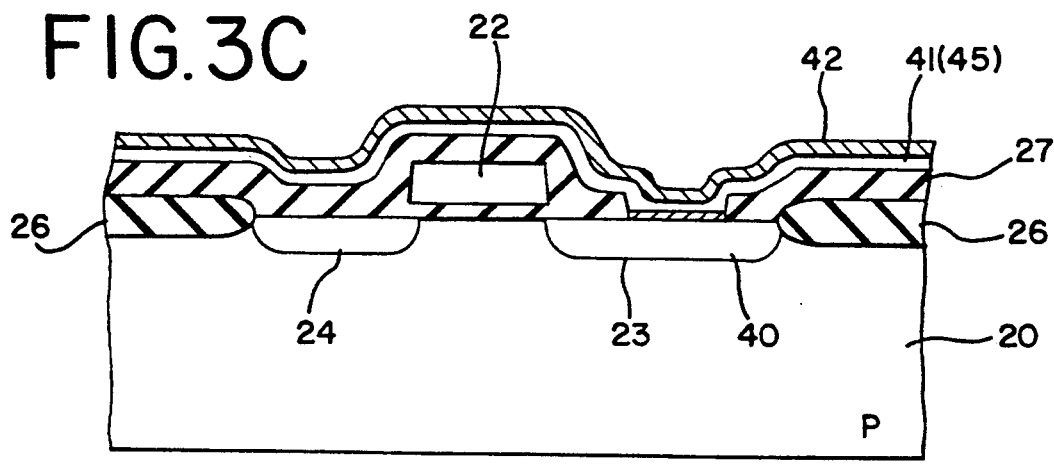
Figure 4:
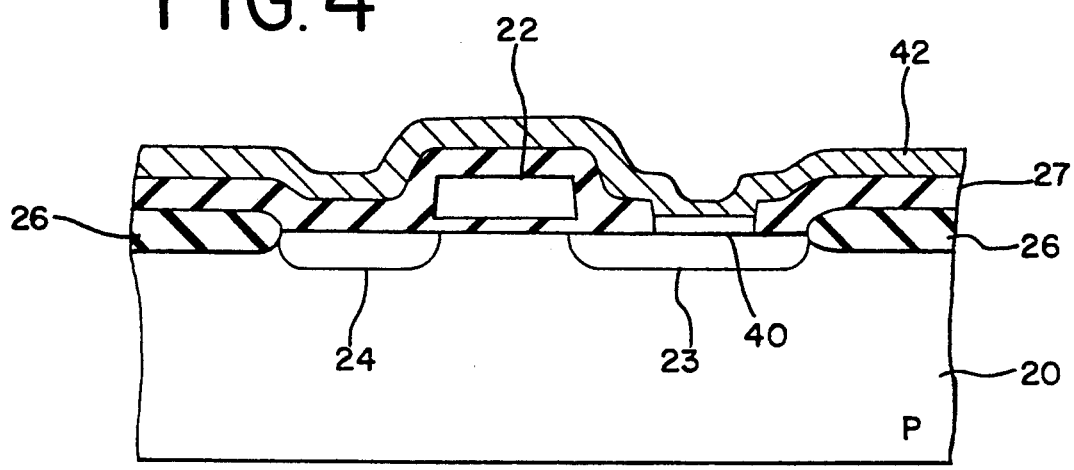
FIG. 4 is a cross section view showing another semiconductor structure according to Example 2.

First, as shown in FIG. 3(A), a gate electrode 22 is formed, and thereafter a high concentration N type source region 23 and a drain region 24 are formed within a P type semiconductor substrate 20 by self alignment. Next, phosphorus glass is coated on the whole surface, and a first interlayer insulating film 27 is formed. Next, the interlayer insulating film on the source region 23 is etched to open a contact hole 27a. Next, as shown in FIG. 3(B), as the metal for forming a conductive oxide by a sputtering method, a rhenium (Re) film 45 is coated on the whole surface in a thickness of 2000 Å. Thereby, the contact hole is filled with rhenium (Re). Thereafter, a heat treatment is applied in an oxygen-containing atmosphere. The (upper) surface side of the rhenium (Re) film 45 is oxidized by this oxygen annealing, and a conductive oxide film 42 of rhenium oxide (ReO$_2$) is formed. Moreover, on the side where the source region 23 and the rhenium (Re) film 45 are in contact, a metal silicide film 40 consisting essentially of Re is formed. As a result of this oxygen anneal, as shown in FIG. 4, it is preferable to change the (upper) surface side of the rhenium oxide (ReO$_2$) and change the lower surface side (rear side) thereof into the metal silicide film 40, respectively, or as shown in FIG. 3(C), the conductive metal film 41 of rhenium (Re) preferably partly remains as is without any change. The significance of directly depositing the metal film 45 for forming a conductive oxide on the source region 23 is advantageous in function and process as compared with a method of forming a conductive oxide shown in Example 1. Reduction of contact resistance and reduction of access time by self-formation of the metal silicide film 40 is successfully obtained in the form with no additional process.

EXAMPLE 3

Figure 5:
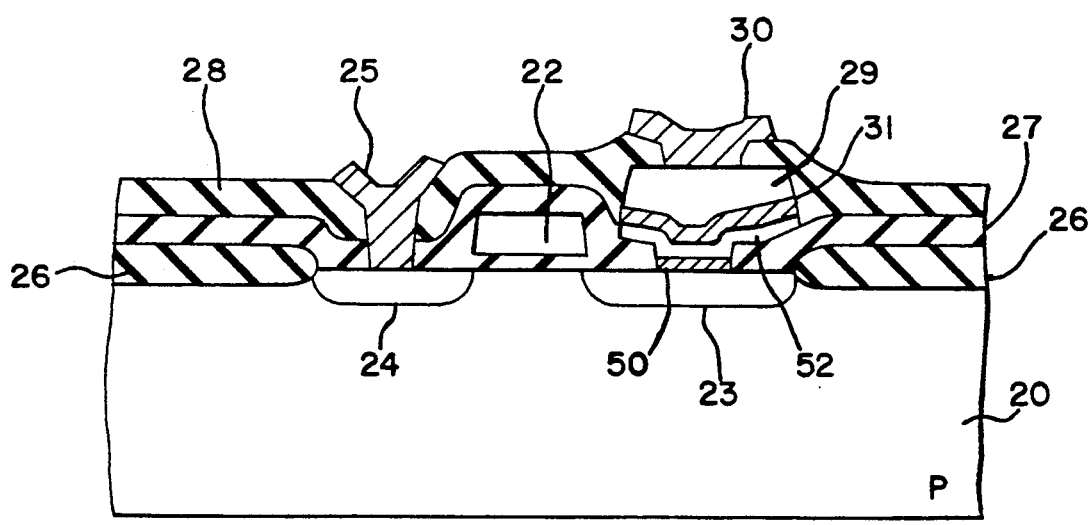
FIG. 5 is a cross section view showing the semiconductor device having a ferroelectric capacitor as in Example 3 of the present invention.
Figure 6:
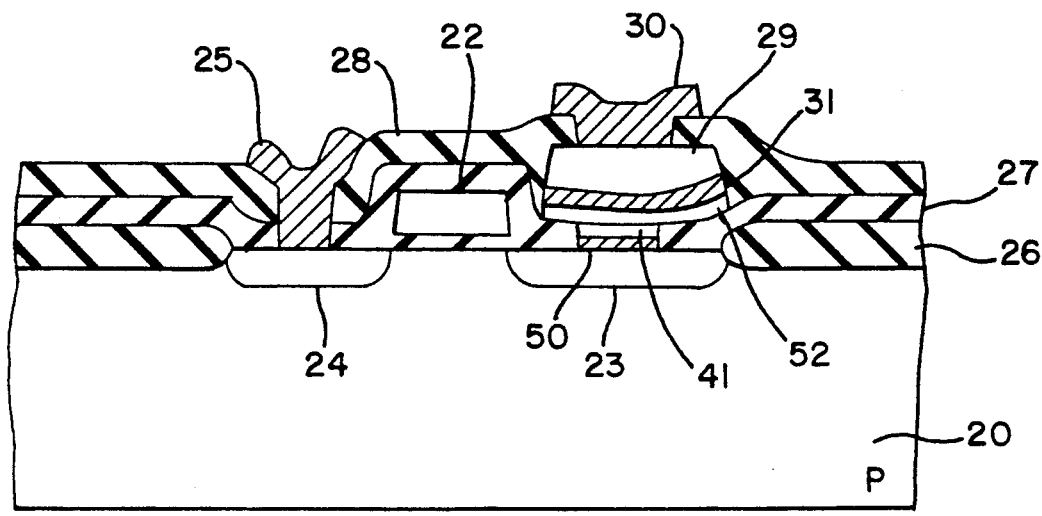
FIG. 6 is a cross section view showing another semiconductor structure according to Example 3.

FIG. 5 is a cross section view showing the semiconductor device having a ferroelectric capacitor according to Example 3 of the present invention. In FIG. 5, like parts shown in FIG. 1 are designated by like reference numerals and the explanation thereof is omitted. In this Example, the ferroelectric capacitor C is stacked and formed on the source region 23. Between the source region 23 and the lower electrode 31 are successively stacked a Pt silicide film 50 and a conductive oxide film 52. The conductive oxide film 52 comprises ITO, rhenium oxide (ReO$_2$), ruthenium oxide (RuO$_2$) or molybdenum oxide (MoO$_3$) or the like. Between the source region 23 and the conductive oxide film 52 is sandwiched the Pt silicide film 50. This is for reducing contact resistance. The Pt silicide film 50 is formed by depositing Pt in a thickness of 1000 Å by a sputtering method. A contact hole is burred (established), and thereafter the Pt in the contact hole is reacted with the Si of the source region 23 by a heat treatment, and a Pt silicide is formed. Thereafter, non-reacted Pt is removed with aqua regia. The conductive oxide film 52 is formed on the Pt silicide film 50 by a sputtering method. It is a matter of course that the conductive oxide is not directly sputtered, but, as described above, a metal for forming a conductive oxide (Re, Ru, Mo or the like) is sputtered to form a metal film, and thereafter the conductive oxide film is formed by an oxygen anneal. In such a case, as shown in FIG. 6, there is no problem in allowing a portion of the metal film 41 to remain because both the conductivities are substantially the same.

Figure 7:
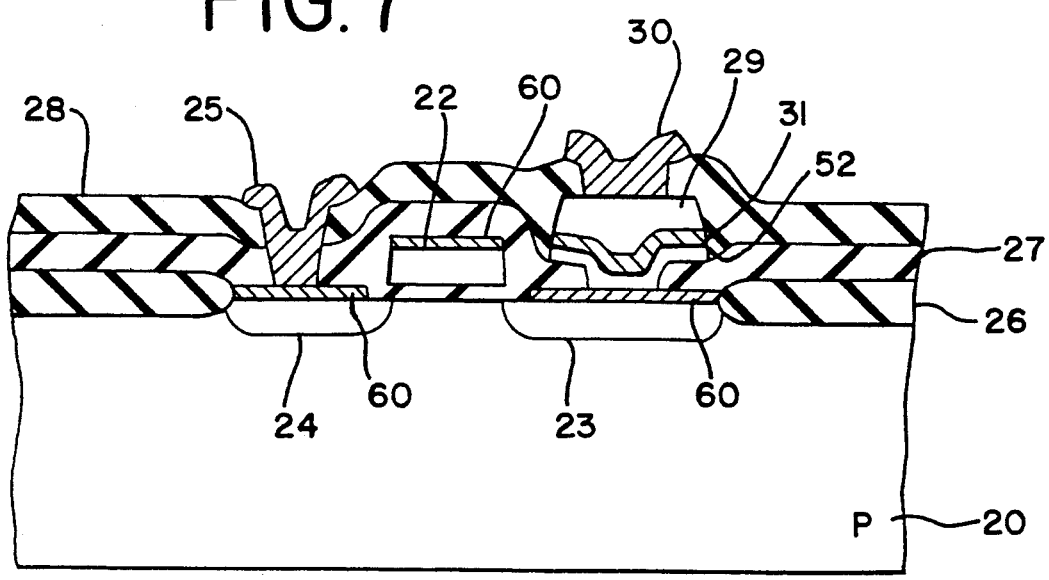
FIG. 7 is a cross section view showing a modification according to Example 3.

FIG. 7 is a cross section view showing a modification of the semiconductor device according to this Example. In the above Example, the Pt silicide film 50 is formed only within the contact hole, but in this modification, a Pt silicide film 60 is formed on the source region 23, the drain region 24 and the gate electrode 22 by self aligned silicide (metal silicide). Even in such process is employed, contact resistance of the source-contact portion can be reduced.

In each of the above Examples, a Pt silicide film is formed. However in another embodiment, a mixed film of silicon and titanium (Ti) can be deposited so as to form a Ti silicide film by a heat treatment, or metal such as Ru, Re, Mo, W, Ta and Pd can be used to form the metal silicide.

As the forming structure of the above-described ferroelectric device on a diffusion region or substrate, a non-volatile memory is used as an example, but it is a matter of course that the ferroelectric can be applied to a memory (DRAM) with the aid of a large constant dielectric constant and a circuit network requiring a high capacitance. Moreover, the present invention can be applied to form a piezoelectric element, an elastic wave element and a pyroelectric element on a semiconductor substrate.

The semiconductor device having a ferroelectric device and the method of manufacturing the same according to the invention provides a ferroelectric-forming structure on the main plane of or inside of a silicon substrate and the like. The region of a ferroelectric forming structure may be an intrinsic semiconductor region or an N-type or P-type region of an impurity diffusion region. Typical examples are the source region or the drain region of an MIS-type transistor and the impurity diffusion region of three electrodes of a bipolar-transistor, but it is possible to form the ferroelectric forming structure on not only the active region of an active element but also on each region of a passive element such as a diffusion resistance layer or stopper region. It is also possible to form the ferroelectric capacitor structure stacking on the diffusion region and to form the ferroelectric forming structure within a trench. The invention is applicable to a non-volatile memory which requires high density integration.

I claim:

1. A ferroelectric capacitor for use in a semiconductor device, said capacitor comprising:
   a substrate;
   a conductive oxide film located over said substrate, wherein said conductive oxide film comprises at least two of the compounds selected from the group comprising ruthenium oxide, rhenium oxide, molybdenum oxide and indium tin oxide;
   a bottom electrode located over said conductive oxide film;
   a layer of ferroelectric material located over said bottom electrode; and
   a top electrode located over said layer of ferroelectric material.

2. A ferroelectric capacitor for use in a semiconductor device, said capacitor comprising:
   a substrate;
   a metal silicide film located over said substrate;
   a conductive metal film located over said metal silicide film;
   a conductive oxide film located over said conductive metal film;
   a bottom electrode located over said conductive oxide film;
   a layer of ferroelectric material located over said bottom electrode; and
   a top electrode located over said layer of ferroelectric material.

3. The capacitor of claim 2 wherein said metal silicide film comprises a metal selected from the group comprised of titanium, platinum, ruthenium, rhenium, molybdenum, tungsten, tantalum, and palladium.

4. The capacitor of claim 2 wherein said metal conductive film comprises a metal selected from the group comprised of ruthenium, rhenium and molybdenum.

5. The capacitor of claim 2 wherein said conductive oxide film comprises a compound selected from the group comprising ruthenium oxide, rhenium oxide, molybdenum oxide and indium tin oxide.

6. The capacitor of claim 2 wherein said conductive oxide film comprises at least two of the compounds selected from the group consisting ruthenium oxide, rhenium oxide, molybdenum oxide and indium tin oxide.

7. The capacitor of claim 2 wherein said metal silicide film is located over a source region in said substrate.

8. A method for forming a ferroelectric capacitor for use in a semiconductor device, said method comprising the steps of:
   forming a substrate;
   establishing a conductive metal film over said substrate;
   establishing a bottom electrode over said conductive metal film;
   establishing a layer of ferroelectric material over said bottom electrode;
   performing an oxygen anneal, said anneal causing said conductive metal film to form a metal silicide film between said conductive metal film and said substrate and a conductive oxide film between said conductive metal film and said bottom electrode; and
   establishing a top electrode over said layer of ferroelectric material.

9. The method of claim 8 wherein said conductive metal film is established over a source region in said substrate.

* * * * *